United States Patent [19]
Benson et al.

[11] Patent Number: 5,286,919
[45] Date of Patent: Feb. 15, 1994

[54] COMPUTER CABLE MANAGEMENT SYSTEM

[75] Inventors: John W. Benson, Westwood, Mass.; Donald T. Staffiere, Amherst, N.H.

[73] Assignee: Digital Equipment Corporation, Maynard, Mass.

[21] Appl. No.: 722,870

[22] Filed: Jun. 28, 1991

[51] Int. Cl.[5] .......................... H02G 3/08; H05K 5/00
[52] U.S. Cl. ........................................ 174/50; 174/101
[58] Field of Search ................... 174/50, 48, 49, 101

[56] References Cited

U.S. PATENT DOCUMENTS

| | | | |
|---|---|---|---|
| 3,821,688 | 6/1974 | Larsile | 174/101 |
| 4,589,449 | 5/1986 | Bramwell | 174/101 |
| 4,602,124 | 7/1986 | Santucci | 174/101 |

Primary Examiner—Harold Broome
Attorney, Agent, or Firm—Cesari and McKenna

[57] ABSTRACT

A system for managing communication or power cables in proximity to a computer system. The system provides enclosures for routing or housing cables horizontally or vertically. Each enclosure is adapted for attachment to a computer cabinet, is easily installed and provides direct access for cable installation. The enclosures provide enhanced safety for personnel working in the area as well as presenting an outward appearance which is aesthetically pleasing and complementary with that of the computer system to which they are attached.

21 Claims, 8 Drawing Sheets

FIG. 8 ary of the invention

COMPUTER CABLE MANAGEMENT SYSTEM

BACKGROUND OF THE INVENTION

1. Field of the Invention

The present invention relates generally to the field of devices for housing and routing communication or power cables and, more specifically, to a cable management system for use with a computer system.

2. Discussion of the Prior Art

Computers classified as "minicomputers" or "mainframes" are usually housed in one or more cabinets which stand upright on a floor. Typically, a number of cables are routed to or from such cabinets to provide communication paths between the processing, memory or input/output circuitry housed within the cabinets and "peripheral" devices such as disk or tape drives, printers, or user terminals. Other cables are also required to supply power to the computer system.

In the aggregate, such communication and power cables may be quite bulky and difficult to accommodate. This problem is aggravated where the computer system is not installed on a raised floor which is designed to provide an enclosed space or raceway beneath the floor for routing the cables. Also, because the cables are usually not cut to length, they are generally longer than actually required, which results in coils of excess cable disposed in proximity to the computer cabinets. Obviously, coils of cable lying on the floor near pedestrian traffic are not only subject to damage but also represent a serious safety hazard.

In addition, many computer installations include an overhead power bus or raceway from which cables descend vertically to connect with the computer system. Such vertical cable drops also pose a safety hazard since, in the absence of a conduit or enclosure, the cables hang freely from the raceway and may easily become tangled or disturbed by casual contact.

Finally, the sight of bulky cables lying on the floor of a computer room or hanging from an overhead raceway is not aesthetically pleasing. A computer room in which many thousands of dollars' worth of sophisticated electronic equipment is installed should appear neat and orderly, in addition to being safe for persons working therein.

SUMMARY OF THE INVENTION

In brief summary, the present invention provides a system for managing communication and power cables associated with a computer system. The invention provides two types of enclosed cable raceways for horizontally and vertically oriented cables, respectively. The outward appearances of the enclosed raceways are aesthetically attractive and present an appearance of uniformity and integration with the computer system with which they are associated.

The enclosed cable raceways are adapted to mechanically interface with a cabinet. The enclosures may be used separately or in combination to meet the requirements of a particular application. In addition, the enclosures may be used in conjunction with either raised or conventional floors.

The first cable enclosure is for cables which are routed horizontally or downwardly (towards or through the floor) and is adapted for attachment to the frame of a cabinet near the floor. This cable enclosure provides an interior space which is accessed by way of a door. When the door is open, an installer may arrange or inspect one or more cables within the interior space. The inside surface of the door provides a convenient area for recording desired information such as cable identification or routing data. When the door is closed, the cables within the interior are safely enclosed and concealed from view. If necessary, the door may be completely removed by virtue of disengageable pivot members.

The bottom portion of the first cable enclosure forms a horizontal load-bearing cable raceway in which a plurality of spaced apart apertures are disposed. Such apertures provide convenient locations through which cables may enter or leave the raceway.

The first cable enclosure also features removable side skirts which may be removed to allow one or more cables to pass through to an adjacent cable enclosure (e.g., either another horizontal cable enclosure or a vertical cable enclosure as described below) or simply exit from the enclosure.

The second cable enclosure provided by the present invention is for cables which are routed vertically (e.g., to or from an overhead raceway) and includes a vertical load-bearing cable raceway or support which is adapted to mechanically attach to a cabinet. Each edge of the cable support forms a lipped slot which frictionally engages a flange. The cable support includes a plurality of anchor points or apertures for fastening one or more cables thereto by means of tie wraps, cable clamps or the like. The cable support also includes an aperture through which cables may enter or exit from the cabinet.

The second cable enclosure further includes a removable cover having flanged edges which are dimensioned to engage the lipped slots of the cable support. When engaged, the removable cover encloses the cables disposed in the raceway.

The second cable enclosure may also include a cable support extension member. The edges of the extension member form lipped slots like those of the support and are thus similarly engageable with the cover. When installed, one end of the extension member rests on top of one end of the cable support, thereby extending the height of the second cable enclosure. The extension member and cover may be cut to length to reach a desired height.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
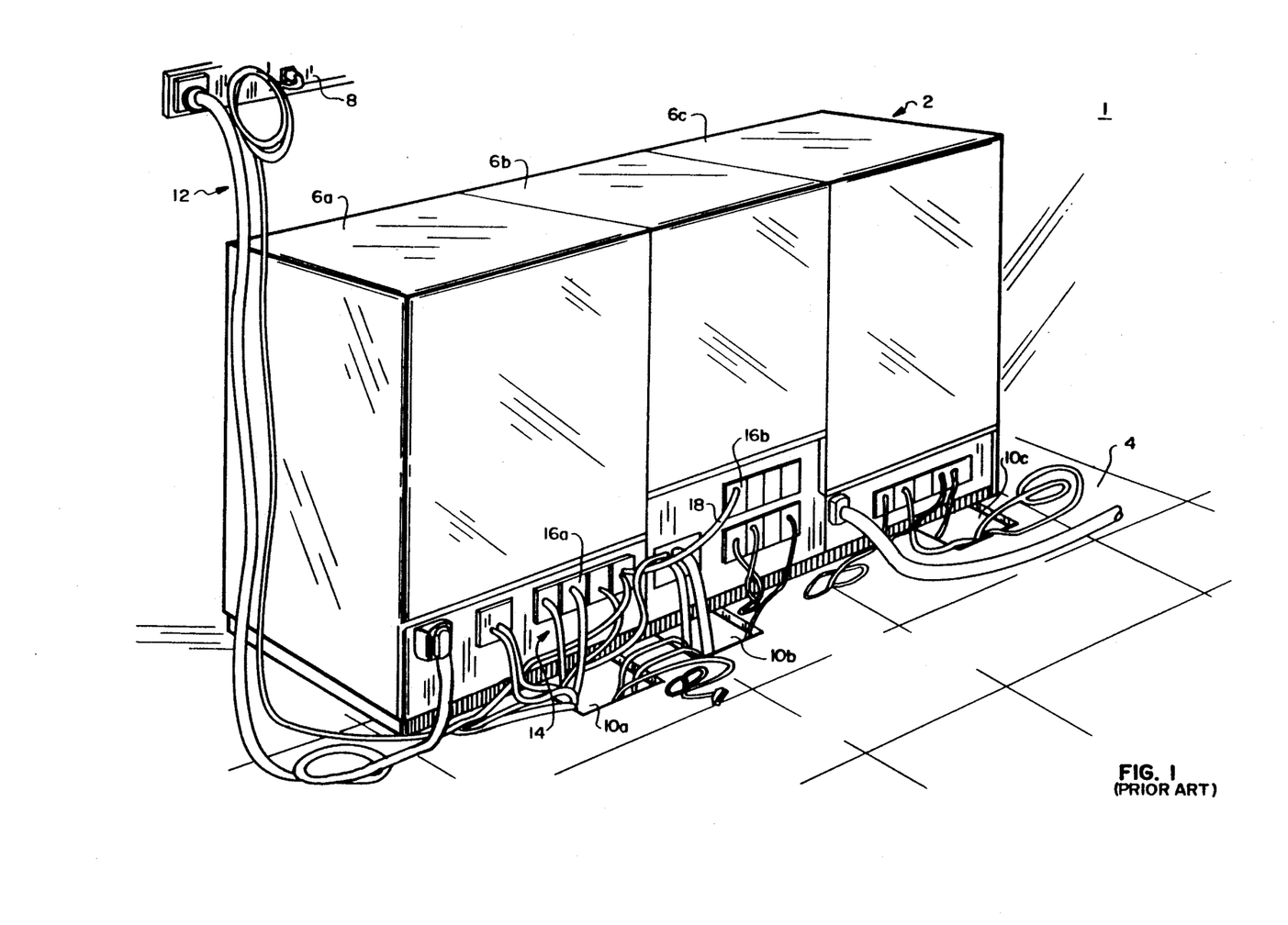
FIG. 1 is a perspective view of a computer installation known in the prior art in which no cable enclosures or cable management is provided.

FIG. 1 shows a computer room 1 in which a computer system 2 is seated on a raised floor 4. The type of computer installation depicted is known in the art. Illustratively, three upright cabinets 6a, 6b and 6c house various sections or modules of electronic processing or storage circuitry such as central processing units (CPUs), main memory, input/output (I/O) circuitry and the like. Suspended from the ceiling is an overhead cable raceway/power bus 8.

In order to supply electrical power to the circuitry housed within the cabinets 6, as well as provide communication paths between such circuitry and external equipment such as mass storage devices, printers, terminals, etc. (not shown) which are remotely located, a plurality of cables are routed and connected to the cabinets 6. Some cables, such as those denoted by reference numeral 12, descend vertically from the raceway/bus 8 and then laterally along the floor 4. Other cables, such a those denoted by reference numeral 14, are routed beneath the floor 4, upward through a floor cut-out 10a and terminated at terminals 16a. In addition, one cable 18 is used to interconnect terminals 16a and 16b which are located on cabinets 6a and 6b, respectively.

As is clear from FIG. 1, numerous cables are undesirably exposed and subject to damage or inadvertent contact with personnel working within the computer room 1.

Figure 2:
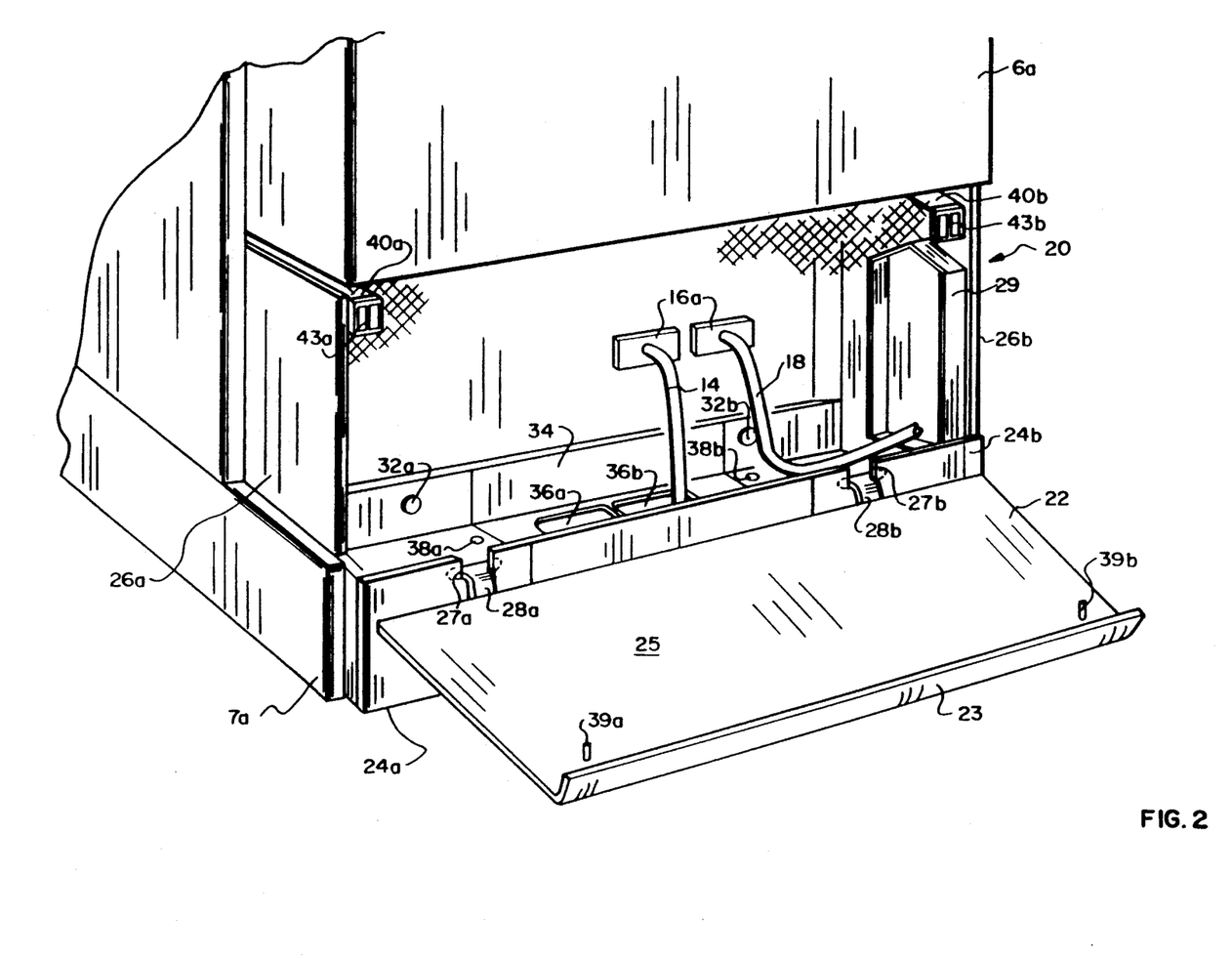
FIG. 2 is a perspective view of a cable enclosure for horizontally oriented cables constructed in accordance with a preferred embodiment of the present invention.

FIG. 2 shows a preferred embodiment of a cable enclosure 20 for routing and housing communication or power cables in proximity to a computer cabinet or other housing. For consistency and clarity, elements shown in FIGS. 2–8 which correspond with elements of prior figures are designated by like reference numerals.

Figure 3:
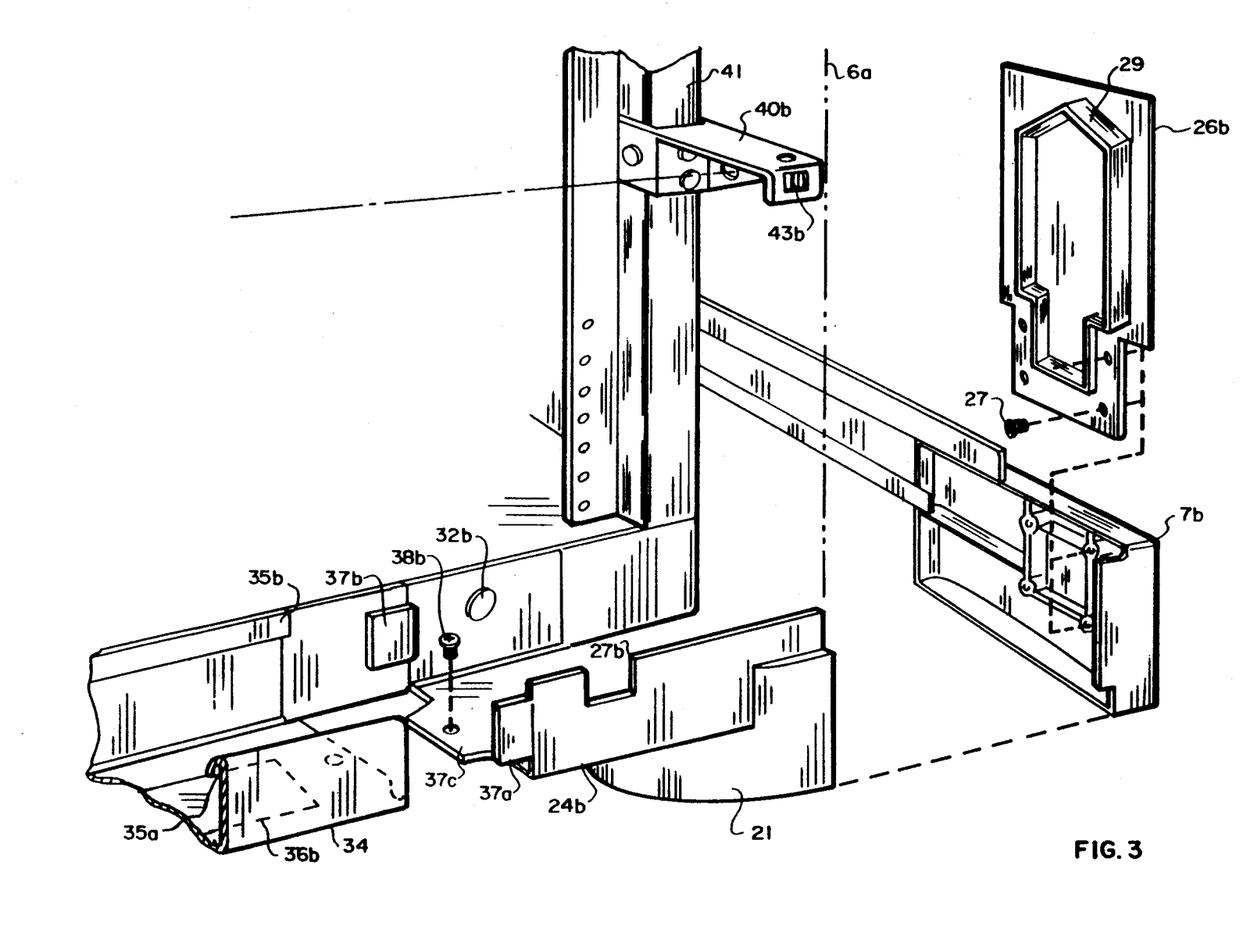
FIG. 3 is an exploded, perspective view of a portion of the enclosure shown in FIG. 2.

The enclosure 20 is disposed near the base of cabinet 6a between two lower side skirts 7a and 7b (FIGS. 2 and 3). An access door 22 is detachably secured to two end caps 24a and 24b. As may be sen more clearly in FIG. 3, each end cap 24 includes a cowl 21 which may, for example, serve to conceal a caster (not shown) which supports the cabinet 6a.

A fastener 32 secures each end cap 24 to the cabinet 6a. Each fastener 32 is dimensioned to engage with an aperture (not shown) provided in the chassis or frame of the cabinet 6a. The fasteners 32 are preferably of the insertable-locking type which are engaged when pressed into place and rotated one-quarter turn.

Notches 27a and 27b located in the top edges of end caps 24 are dimensioned to engage two T-shaped pivot members 28a and 28b, respectively (FIG. 2), which are attached to the lower edge of door 22. The narrow portion of each pivot member 28 is formed with a bend of approximately 90° such that the door 22 may pivot beyond horizontal when opened, thereby allowing easier access to the interior of the enclosure 20. Conversely, when the door 22 is closed, the narrow portions of the pivot members 28 rest, respectively, on the bottoms of the slots 27 to support and vertically position the door 22. If necessary, the door 22 may be completely disengaged from the end caps 24 by lifting it upward until the pivot members 28 clear the notches 27. Thus, the combination of notches 27 and pivot members 28 advantageously provides an access door which swings open or closed in a manner similar to a conventional hinged door, while also being easily disengaged and removed.

The door 22 is fitted with two male latch members 39a and 39b which, when the door is closed, engage with two female latch members 40a and 40b, respectively. As shown more clearly in FIG. 3, each female latch member 40 may be attached to a frame 41 of the cabinet 6a. Each latch member 40 includes a snap-in insert 43 having a slot which is dimensioned to receive a corresponding male latch member 39.

An integral flange or lip 23 extends laterally across the top edge of the door 22. When the door 22 is closed, the lip 23 serves to create an outward appearance of a "soft" corner, as opposed to a sharp edge or break. In addition, the lip 23 serves to stiffen the door 22. An interior surface 25 of the door 22 provides a convenient area for recording desired information (e.g., cable routing or identification data), which may be referred to when the door 22 is open.

A load-bearing cable raceway 34, in which a plurality of spaced apart apertures or cable penetrations 36 are disposed, is located between the end caps 24. As may be seen more clearly in FIG. 3, the raceway 34 has a U-shaped cross-section whose upper edges are rolled over to form grooves 35a and 35b. Each end cap 24 includes two integral tabs 37a and 37b which are dimensioned to slidingly engage the slots 35, respectively, and a third integral tab 37c which slides underneath the raceway 34. The tabs 37 thus support the raceway 34 on the end caps 24. The raceway 34 is secured to the end caps 24 by fasteners 38a and 38b, respectively, which are preferably plastic drive rivets that pass through the bottom of the raceway 34 and the tabs 37c.

Referring again to FIG. 2, two removable upper side skirts 26a and 26b form the sides of the cable enclosure 20. Each upper side skirt 26 is preferably attached to its associated lower side skirt 7 by four self-tapping screws 27. The inward-facing side of each upper side skirt 26 includes an integral rib 29 for increased stiffness. Preferably, the upper side skirts 26 are symmetrical so that they may be attached to either end of the enclosure 20.

Figure 4:
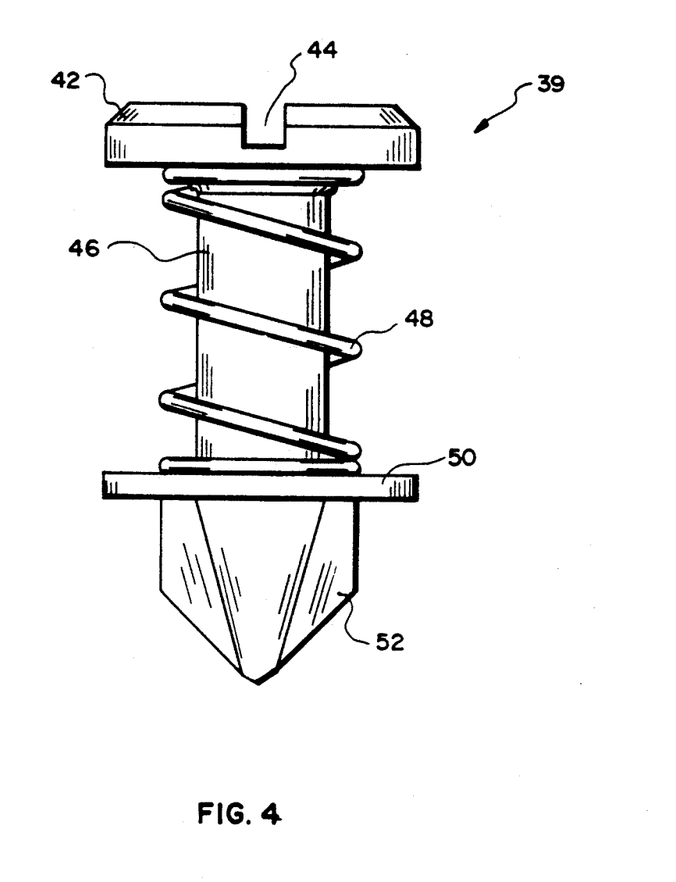
FIG. 4 is an enlarged side view of one of the door latches shown in FIG. 2.

The latch members 39 are preferably of a conventional quick-release type as shown, for example, in FIG. 4. A latch head 42 includes a slot 44 which is shaped to receive a flat blade screwdriver, coin or similar article. The head 42 is mounted on a shaft 46 which is slideably engaged with an apertured stop member 50. A spring 48 encircles the shaft 46 and exerts a biasing force which tends to displace the head 42 away from the stop member 50. A tapered locking member 52, connected to the shaft 46 opposite the head 42, is in contact with the stop member 50 when the head 42 is biased to its maximum displacement. The locking member 52 is dimensioned to pass through the slot in the insert 43 of the female latch member 40 when properly oriented.

Except for the fasteners 32 and portions of the latch members 39, 40, the components of the enclosure 20 are preferably made of plastic which is inexpensive, lightweight, corrosion resistant and non-conductive.

Referring to both FIGS. 2 and 3, the operation of the enclosure 20 will now be described. In general, the enclosure 20 may be used to house or route communication or power cables (or both) in a desired fashion to meet the requirements of a particular application. Once the enclosure 20 is assembled and secured to the cabinet 6a, an installer simply opens the access door 22 and proceeds to route or arrange the cables as necessary. For example, if a raised floor is located beneath the enclosure 20, one or more cables such as cable 14 may be routed downwardly from the terminations 16a, through one or more apertures 36 and then through a cut-out in the raised floor.

Alternatively, cables such as cable 18, which are destined for an adjacent cabinet 6 or other laterally located destination, may be routed laterally along the raceway 34 and end caps 24 and through an opening exposed by removing one of the upper side skirts 26. For example, as shown in FIG. 5, a cable port 70 may represent an upper side skirt 26 which has been removed from cable enclosure 20 to allow cables to pass laterally outward from enclosure 20.

Once the necessary cable routing is complete and any desired information is recorded on the inside surface of the door 22, the door may be closed and the latch members 39 engaged as described above. Any excess cable may be bundled or coiled, if necessary, and stored within the enclosure 20. With the door 22 closed, all cables are safely housed within the enclosure 20 and completely concealed from view except for a small portion visible through any gap between the floor and bottom edges of the end caps 24.

Figure 5:
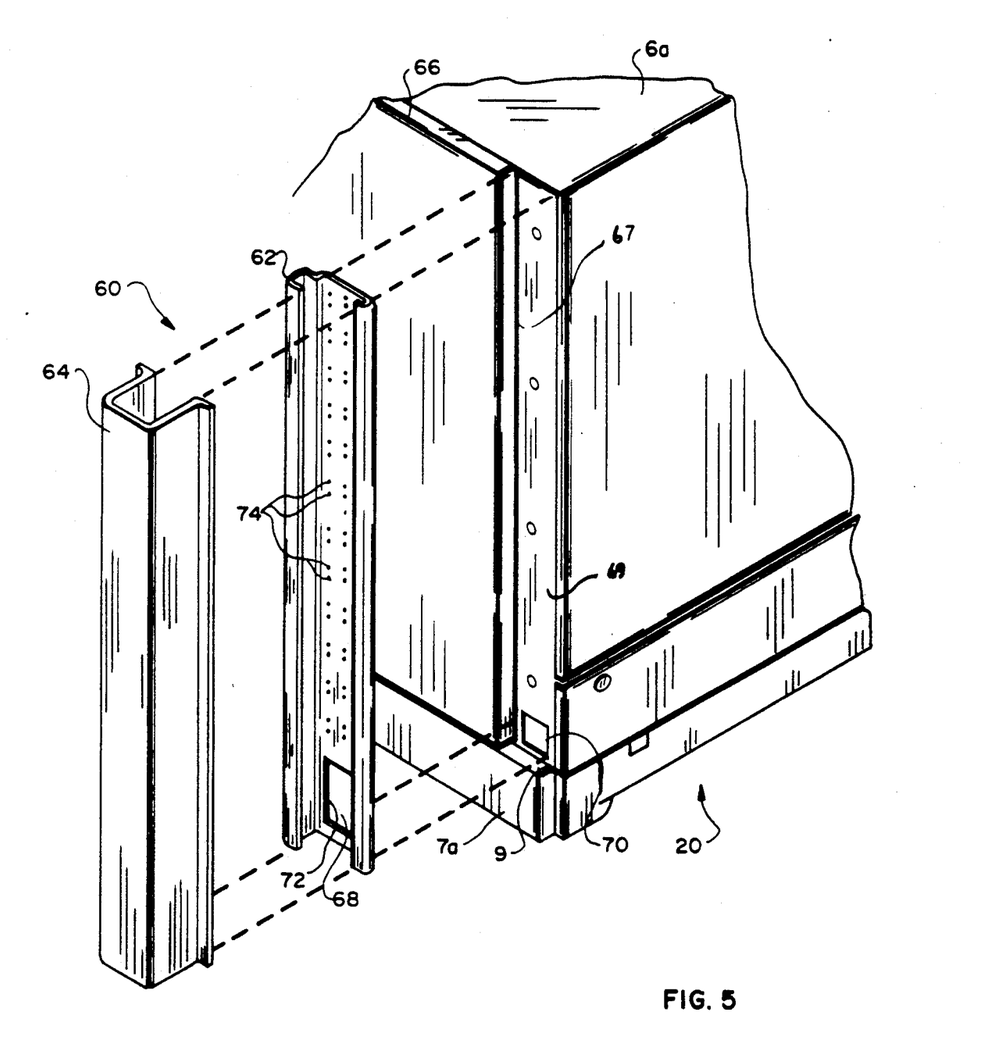
FIG. 5 is an exploded, perspective view of a cable enclosure for vertically oriented cables constructed in accordance with a preferred embodiment of the present invention.

FIG. 5 shows a preferred embodiment of a cable enclosure 60 for routing or housing cables in a generally vertical orientation. As described below, the enclosure 60 is preferably used in conjunction with the cable enclosure 20 previously described, but may be used separately if required.

The enclosure 60 comprises a cable support 62 and a removable cover 64. The top ends of the support 62 and cover 64 are open to allow one or more cables to enter from above (e.g., from an overhead raceway/bus). The support 62 is attached to the edge of a side panel 66 of the cabinet 6a. A gap 67, located between side panel 66 and a corner 69 of the cabinet 6a, provides sufficient clearance for attaching the support 62, as described below in connection with FIG. 6.

The lower end of the support 62 abuts a top edge 9 of the lower side skirt 7. An aperture 68 which, when the support 62 is installed, is substantially aligned with the cable port 70 allows cables to enter or exit the raceway 34 of the enclosure 20. The aperture 68 is preferably lined with a protective gasket or grommet 72. Thus, the combination of the enclosures 20 and 60 permits one or more communication or power cables to advantageously be routed both horizontally and vertically while remaining completely and safely enclosed.

The cable support 62 also includes a plurality of apertures or cable anchor points 74 dispersed along its length. The length of the cable support 62 is preferably substantially the same as the distance from the edge 9 of the lower side skirt 7 to the top edge of the side panel 66.

The cable support 62 is preferably made of metal since it bears the load of both the cover 64 as well as any cables attached to the support. The cover 64 is preferably made of plastic so that it is both lightweight and somewhat flexible.

Figure 6:
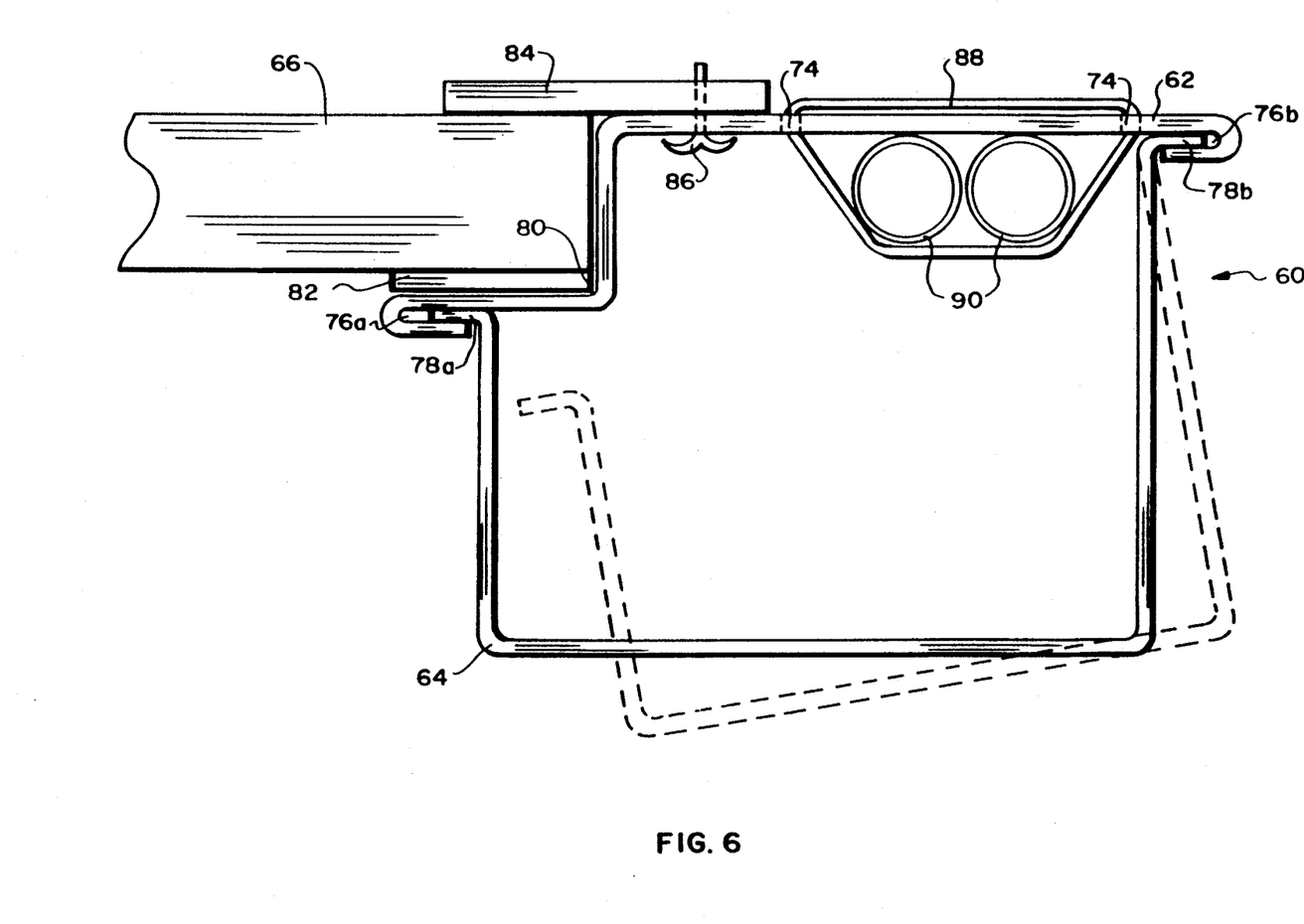
FIG. 6 is a cross-section of an assembled enclosure of the type shown in FIG. 5.

As may be seen more clearly in FIG. 6, which is a cross-section of an assembled enclosure 60, the edges of the cable support 62 are rolled over to form grooves 76 which are dimensioned to frictionally engage flanged edges 78 of the removable cover 64. As shown in phantom, the cover 64 is preferably engaged with the cable support 62 by first inserting flange 78b into groove 76b, then rotating and slightly compressing the cover 64 so that flange 78a may enter groove 76a.

The support 62 includes a longitudinally-extending interior corner 80 which is dimensioned to fit an exterior corner of the side panel 66. A pad 82 which is covered with adhesive material on both sides serves to secure the support member 62 to the side panel 66. Preferably, the support member 62 is manufactured with one side of the adhesive pad 82 attached thereto and a peelable "release strip" covering the other side of pad 82.

A compression member 84 abuts the back surface of the side panel 66. The member 84 is secured to the cable support 62 by one or more screws 86 or similar fasteners. Initially, the screws 86 are loose so that the support 62 may be easily positioned on the edge of side panel 66. Once the adhesive pad 82 is attached to the side panel 66, the screws 86 are tightened, thereby drawing the compression member 84 fast against the side panel 66. As a result, the member 84 strengthens the bond of the cable support 62 to the side panel 66 and also tends to prevent the support 62 from rotating about its longitudinal axis which might damage or dislodge the adhesive pad 82.

A pair of communication or power cables 90 is secured to the cable support 62 by means of a tie wrap 88. It should be understood that any number of cables may be secured to the support 62, provided that there is sufficient clearance within the cover 64. The tie wrap 88 encircles the cables 90 and passes through a pair of anchor apertures 74. Other conventional fastening devices such as cable clamps may alternatively be used to secure the cables 90 to the support 62.

Figure 7:
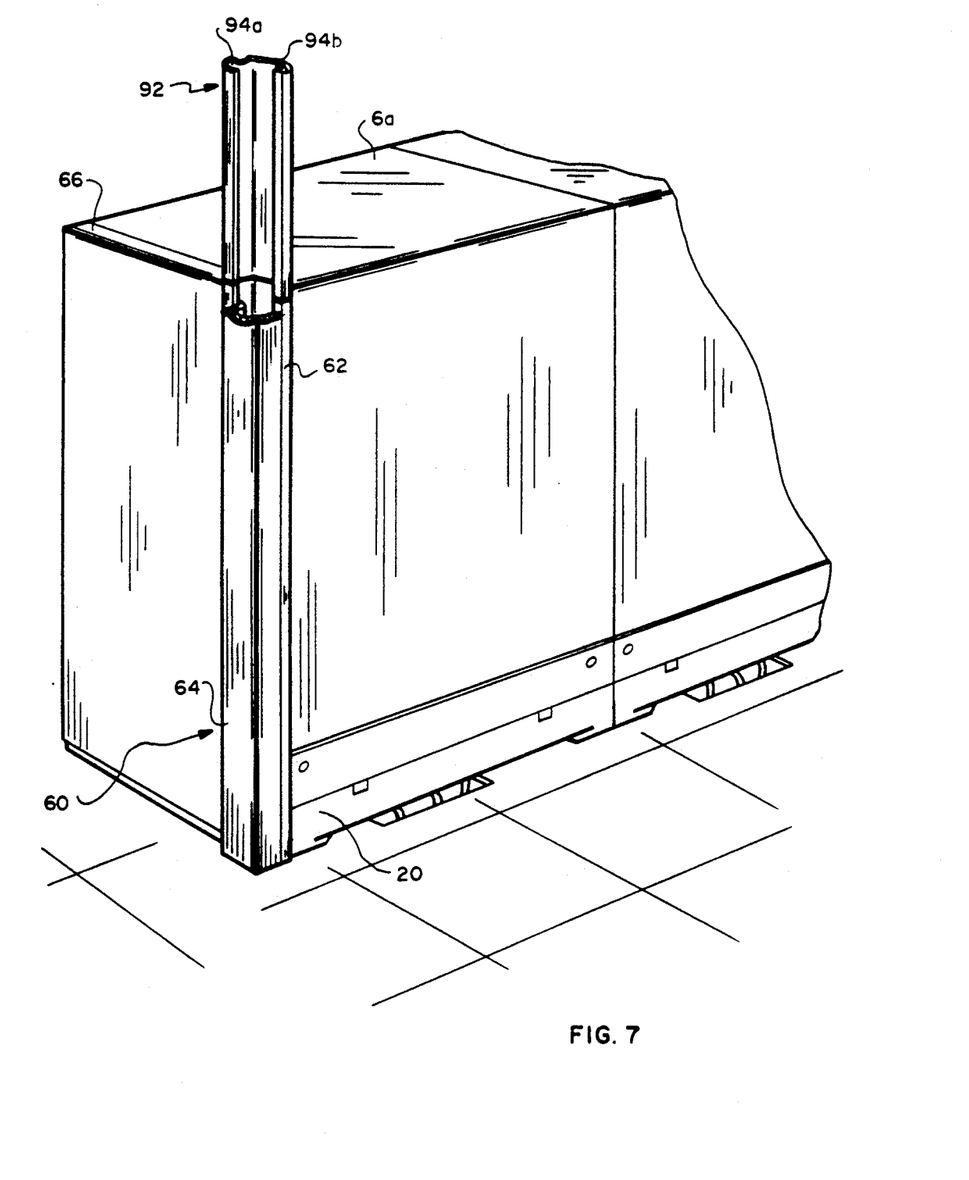
FIG. 7 is a perspective view of an assembled vertical cable enclosure with the addition of an extension member.

Turning now to FIG. 7, a cable support extension 92 may be seated on the normally open top end of the cable support 62. The extension 92 has grooved or slotted edges 94 which are similar in shape to the grooves 76 of the cable support 62. Thus, the extension 92 is similarly engageable with the cover 64. The extension 92 is preferably made from a plastic material.

The extension 92 may be used, in conjunction with the cover 64, to effectively extend the height of the cable enclosure 60 above the top edge of the side panel 66 (the height of the cabinet 6a). That is, the cover 64 and extension 92 may be cut to length to extend the enclosure 60 to a desired height above the cabinet 6a to meet the requirements of a particular application. The extension 92 is preferred for this purpose for the following reasons.

First, the cable support 62 is a load-bearing or structural element which is necessarily secured to the side panel 66. It is therefore undesirable to make the support 62 longer than the height of the panel 66 since a portion of the support 62 would then be unsecured. Second, to provide flexibility in allowing an installer to either initially, or as a subsequent modification, extend the enclosure 60 to a desired height above the cabinet 6a, it is preferable to limit the length of support 62 to the height of the panel 66. Third, because the cover 64 and extension 92 are non-load bearing elements and are preferably made of plastic, they are much more easily cut to length by an installer than the cable support 62 (which is preferably made of metal).

Figure 8:
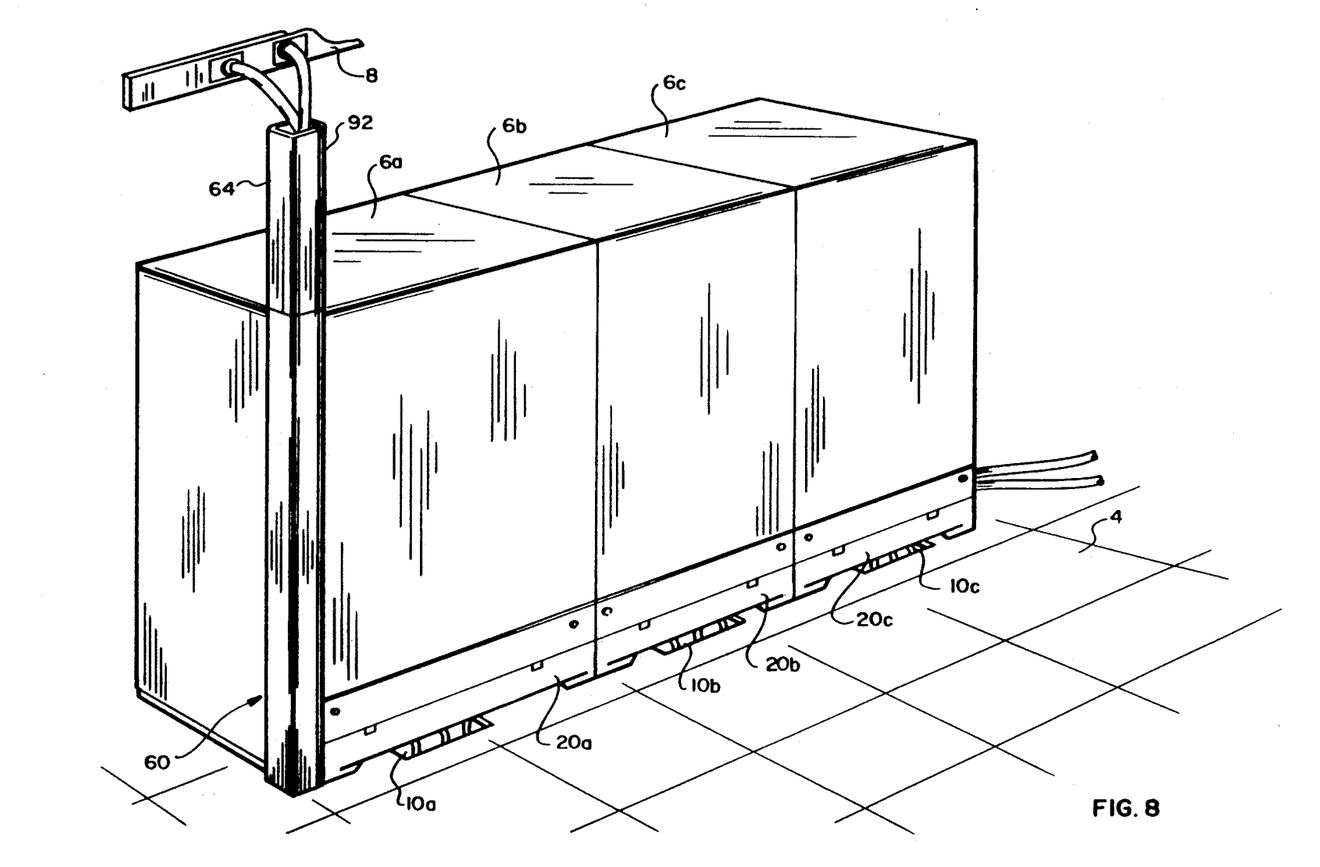
FIG. 8 is a perspective view of a computer system having an integrated cable management system, constructed in accordance with a preferred embodiment of the present invention, which incorporates both vertical and horizontal cable enclosures.

FIG. 8 is a perspective view of an integrated cable management system which incorporates cable enclosures 20 and 60 described above. The vertical enclosure 60 includes the support extension 92 which, in conjunction with the cover 64, extends the height of the enclosure 60 above that of the cabinets 6. Enclosures 20 and 60 safely and neatly enclose various communication or power cables and route them as required to the overhead raceway/bus 8, through raised floor cut-outs 10 or laterally outward from cabinet 6c to another desired location. The enclosures 20 and 60 appear mechanically integrated with the cabinets 6, while providing direct, easy access to the enclosed cables should inspection or changes in routing be required.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A cable management apparatus for housing and routing one or more communication or power cables, said apparatus comprising:
    cable enclosure means attached to a surface, the cable enclosure means having a door for gaining access to the interior of the enclosure means and having at least one opening opposite said door through which cables may enter said interior, the cable enclosure means including means for attaching to an appliance cabinet, wherein the cables to and from said appliance enter said interior through said opening; and
    cable support means, disposed within said enclosure means, for supporting one or more cables in a generally horizontal orientation, said cable support means including one or more apertures for allowing cables from other than said appliance to enter said interior in a generally vertical orientation, and allowing cables supported by said cable support means and not plugging into said appliance to exit said interior in a generally vertical orientation.

2. The apparatus as in claim 1 wherein said cable support means comprises a generally horizontal cable raceway having a plurality of spaced apart apertures dimensioned to allow one or more cables to pass therethrough.

3. The apparatus as in claim 1 wherein said cable enclosure means includes at least one removable member which may be removed to allow one or more cables to enter into or exit from said interior in a generally horizontal orientation.

4. The apparatus as in claim 1 further including means for securing the door in a closed position.

5. The apparatus as in claim 4 wherein the securing means includes two latches.

6. The apparatus as in claim 1 wherein the interior side of said door provides an area for recording information.

7. The apparatus as in claim 1 wherein said enclosure means is adapted for mounting to a cabinet.

8. The apparatus as in claim 1 wherein said enclosure means includes two spaced apart notches, and one edge of said door includes two integral pivot members dimensioned to engage said notches, respectively, whereby said door may pivot about said members or said members may be disengaged from said notches.

9. An integrated cable management system for housing and routing communication or power cables in either horizontal or vertical orientations, said system comprising:
    cable enclosure means, attached to a surface in a substantially horizontal orientation, having a door for gaining access to the interior of the enclosure means and having at least one opening opposite said door through which cables may enter said interior;
    first cable support means, disposed within said cable enclosure means, for supporting one or more cables in a generally horizontal orientation and including means for allowing one or more cables to enter into or exit from said interior in a generally vertical orientation;
    second cable support means adapted for attachment to a surface in a substantially vertical orientation and interfaced with said cable enclosure means such that one or more cables may pass therebetween, said second cable support means including cover engaging means; and
    removable cover means adapted for engagement with said cover engaging means, said second cable support means and said removable cover means both being open at one end to allow said cables to exit outwardly therefrom.

10. The system as in claim 9 said first cable support means comprises a generally horizontal cable raceway having a plurality of spaced apart apertures dimensioned to allow one or more cables to pass therethrough.

11. The system as in claim 9 wherein said cable enclosure means includes at least one removable member which may be removed to allow one or more cables to enter into or exit from said interior in a generally horizontal orientation.

12. The system in claim 9 further including means for securing the door in a closed position.

13. The system as in claim 12 wherein the securing means includes two latches.

14. The system as in claim 9 wherein the interior side of said door provides an area for recording information.

15. The system claim 9 wherein said cable enclosure means is adapted for mounting to a cabinet.

16. The system as in claim 9 wherein said second cable support means includes at least one aperture for allowing one or more cables to pass therethrough.

17. The system as in claim 9 wherein said second cable support means includes a plurality of anchors for use in fastening one or more cables to said second cable support means.

18. The system as in claim 9 wherein said second cable support means includes an interior corner extending along its length, said corner being dimensioned to abut an edge of said surface and having an adhesive material disposed thereon, whereby said second cable support means may be adhesively secured to said surface.

19. The system as in claim 18 further including a compression member attached to said second cable support means by a plurality of fasteners and disposed opposite from said interior corner such that said edge is between the compression member and the interior corner, whereby when said fasteners are made fast said edge is compressed therebetween.

20. The system as in claim 9 further comprising support extension means adapted for engagement with said removable cover means, said support extension means being disposed in a substantially vertical orientation extending from one end of the second cable support means.

21. A cable management apparatus for housing and routing one or more communication or power cables, said apparatus comprising:

supportmeans adapted for attachment to a surface in a substantially vertical orientation and providing a load-bearing raceway for one or more cables said support means including
 i. cover engaging means, and
 ii. an interior corner extending along the length of said support means, said corner being dimensioned to abut an edge of said surface and having adhesive material disposed thereon, whereby said support means may be adhesively secured to said surface;

removable cover means, adapted for engagement with said cover engaging means, for enclosing one or more cables and getting access to said raceway, said support means and said cover both being open at one end to allow said cables to extend outwardly therefrom; and a compression member attached to said support means by a plurality of fasteners and disposed adjacent to said interior corner such that said edge is between said compression member and said interior corner, whereby when said fasteners are made fast said edge is compressed therebetween.

* * * * *